(12) United States Patent
Sohn et al.

(10) Patent No.: US 7,482,067 B2
(45) Date of Patent: Jan. 27, 2009

(54) ELECTROLUMINESCENT DEVICE USING METAL NANOPARTICLES

(75) Inventors: Byung-Hee Sohn, Yongin-si (KR); Kyung-Kon Kim, Seoul (KR); Jung-Il Jin, Seoul (KR); Lyong-Sun Pu, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 73 days.

(21) Appl. No.: 10/892,197

(22) Filed: Jul. 16, 2004

(65) Prior Publication Data

US 2005/0276993 A1      Dec. 15, 2005

(30) Foreign Application Priority Data

Oct. 29, 2003    (KR) ............... 10-2003-0075800

(51) Int. Cl.
*H01J 1/62* (2006.01)
*C09K 11/00* (2006.01)

(52) U.S. Cl. ............ 428/690; 428/917; 257/40; 257/103; 252/301.16; 313/504; 313/506

(58) Field of Classification Search .......... 428/690, 428/917, 1.1; 313/504, 506, 502, 512; 252/301.16, 252/301.35; 257/40, 103
See application file for complete search history.

(56) References Cited

U.S. PATENT DOCUMENTS

| | | | |
|---|---|---|---|
| 5,505,928 A * | 4/1996 | Alivisatos et al. | 423/299 |
| 5,621,131 A | 4/1997 | Kreuder et al. | 558/46 |
| 5,763,636 A | 6/1998 | Kreuder et al. | 558/46 |
| 5,859,211 A | 1/1999 | Kreuder et al. | 528/403 |
| 5,900,327 A | 5/1999 | Pei et al. | 428/690 |
| 6,225,198 B1 * | 5/2001 | Alivisatos et al. | 438/497 |
| 6,777,706 B1 * | 8/2004 | Tessler et al. | 257/17 |
| 6,777,724 B2 * | 8/2004 | Duggal et al. | 257/184 |
| 6,884,478 B2 * | 4/2005 | Alivisatos et al. | 428/1.1 |
| 6,995,505 B2 * | 2/2006 | Kim et al. | 313/503 |
| 7,252,699 B2 * | 8/2007 | Perry et al. | 75/345 |
| 2003/0003300 A1 | 1/2003 | Korgel | 428/402 |
| 2003/0047816 A1 * | 3/2003 | Dutta | 257/788 |
| 2005/0274944 A1 * | 12/2005 | Jang et al. | 257/40 |

FOREIGN PATENT DOCUMENTS

KR    1020040093531    11/2004

OTHER PUBLICATIONS

*Office action* from the Korean Intellectual Property Office issued in Applicant's corresponding Korean Patent Application No. 10-2003-0075800 dated Oct. 2, 2006.
*Office action* from the Chinese Patent Office issued in Applicant's corresponding Chinese Patent Application No. 200410063782X dated Jan. 4, 2008.

* cited by examiner

*Primary Examiner*—Bruce H Hess
*Assistant Examiner*—Camie S Thompson
(74) *Attorney, Agent, or Firm*—Robert E. Bushnell, Esq.

(57) ABSTRACT

An electroluminescent (EL) device which has a light emitting layer including metal nanoparticles coated with an organic layer. The metal nanoparticles coated with the organic layer selectively remove an absorption band appearing at an excimer level without affecting a maximum absorption or emission wavelength, thereby enhancing the color purity and emission efficiency of the EL device.

10 Claims, 6 Drawing Sheets

ELECTROLUMINESCENT DEVICE USING METAL NANOPARTICLES

CLAIM OF PRIORITY

This application makes reference to, incorporates the same herein, and claims all benefits accruing under 35 U.S.C. §119 from an application for ELECTROLUMINESCENT DEVICE USING METAL NANOPARTICLES earlier filed in the Korean Intellectual Property Office on Oct. 29, 2003, and there duly assigned Serial No. 2003-75800.

BACKGROUND OF THE INVENTION

1. Field of the Invention

The present invention relates to a light emitting layer for an electroluminescent (EL) device and the electroluminescent employing the same, and more particularly to an improved light emitting layer and an EL device with improved color purity as a result of using metal nanoparticles.

2. Description of the Related Art

Generally, an organic EL device includes a cathode, an organic emission layer, and an anode. Electrons from the cathode and holes from the anode recombine with each other at the organic emission layer to generate excitons. When the excitons are changed from an excited state to a ground state, light emission occurs.

Eastman Kodak Co. developed a multilayer organic EL device including an aluminum quinolinol complex layer and a triphenylamine derivative layer. A use of an organic emission layer including a low molecular weight substance enables broad bandwidth emission ranging from ultraviolet to infrared emission.

Cambridge University reported development of an organic EL device using a polyphenylenevinylene (PPV) film formed by wet coating of conjugated polymer PPV as a light emitting layer. Subsequent to the report by Cambridge University, Covion Co. developed, as light emitting materials, novel PPVs that are soluble in an organic solvent and have good chemical stability and emission efficiency, and Dow Chemical Co. developed polyfluorenes which have good emission property relative to the PPVs. In particular, polyfluorenes have been taken into account as promising blue light-emitting polymers. However, since color purity characteristics are unsatisfactory due to excimers formed by side chains of polyfluorene moieties, there still remains a need for improvement in polyfluorenes based light-emitting materials (U.S. Pat. No. 5,900,327). To improve the color purity characteristics, the conjugated polymer containing 9,9'-spirobifluorene skeleton (U.S. Pat. No. 5,621,131), the conjugated polymer containing a plurality of spiro centers (U.S. Pat. No. 5,763,636), and the conjugated polymers containing heterospiro atoms (U.S. Pat. No. 5,859,211) were developed as light-emitting materials. However, light-emitting materials developed hitherto still exhibit, in particular, unsatisfactory blue emission efficiency and color purity when used in organic EL devices.

Meanwhile, an organic emission layer of an organic EL device includes an organic light-emitting polymer. The photoluminescent (PL) spectrum of such an organic light-emitting polymer is different from the EL spectrum. That is, when excitons are generated while positive and negative charges are migrating toward opposite electrodes, an excimer level is created at a lower energy level than a singlet exciton. The creation of the excimer level induces energy confinement, which prevents an energy transfer. As a result, emission efficiency and color purity are lowered.

SUMMARY OF THE INVENTION

It is therefore an object of the present invention to provide an improved light emitting layer for an electronic luminescent device.

It is also an object of the present invention to provide an improved electronic luminescent device.

It is a further object of the present invention to provide an EL device with improvements in color purity and emission efficiency as a result of removing an emission peak appearing at an excimer level.

The above and other objects may be achieved with a light emitting layer interposed between a pair of electrodes, the light emitting layer comprising a light-emitting material and metal nanoparticles coated with an organic layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
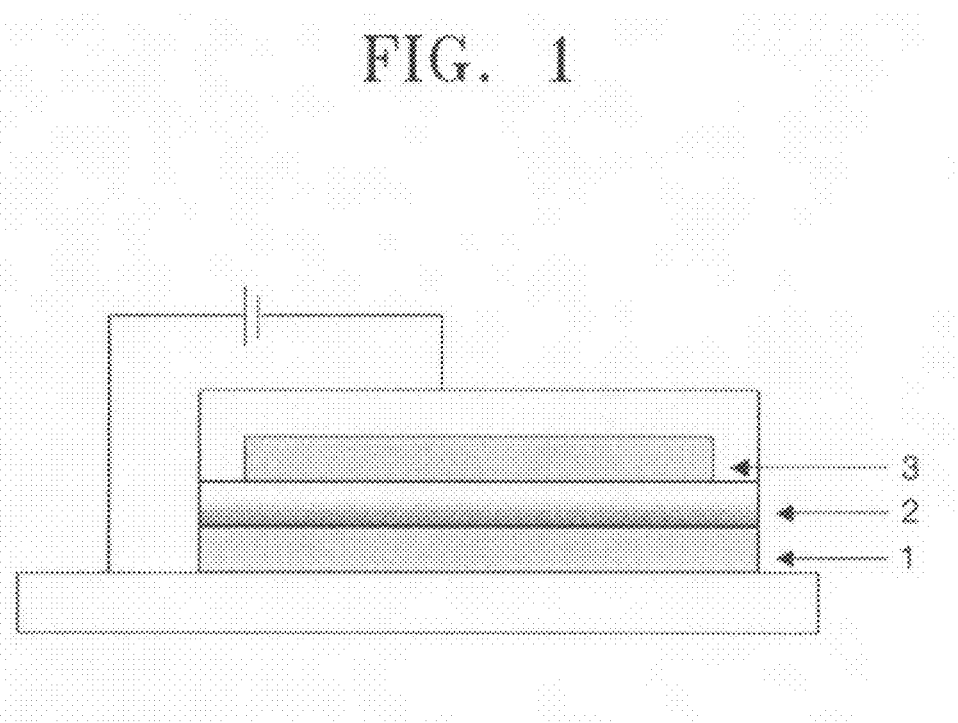
FIG. 1 is a schematic view that illustrates the structure of an EL device according to the present invention.

Hereinafter, the preferred embodiments of the present invention will be described in more detail.

An EL device of the present invention includes a light emitting layer having metal nanoparticles coated with an organic layer. Therefore, an emission peak due to the excimer level is selectively removed, thereby enhancing color purity and emission efficiency.

The size of the metal nanoparticles is a very important factor that determines an absorption band. Preferably, the metal nanoparticles have an average particle diameter of 0.1 to 50 nm. If the average particle size of the metal nanoparticles is less than 0.1 nm, a sufficient light-emitting performance enhancement may not be accomplished. On the other hand, if it exceeds 50 nm, an emission performance enhancement effect such as chromaticity enhancement may be lowered. In particular, thin film formation capability may be remarkably lowered.

Preferably, the metal nanoparticles are one or more selected from the group consisting of lithium (Li), sodium (Na), potassium (K), magnesium (Mg), aluminum (Al), silicon (Si), germanium (Ge), indium-antimony (InSb), gold (Au), and silver (Ag). The organic layer coated on the surface of the metal nanoparticles serves to promote dissolution of the metal nanoparticles in an organic solvent to uniformly disperse the metal nanoparticles and to prevent agglomeration. The organic layer also serves to promote an energy transfer so that removal of an emission peak at a specific wavelength occurs more efficiently.

The organic layer includes one or more organic materials selected from the group consisting of substituted or unsubstituted alkylamine of C1-C50, substituted or unsubstituted alkylthiol of C1-C50, substituted or unsubstituted alkylester of C1-C50, substituted or unsubstituted alkylamide of C1-C50, substituted or unsubstituted alkylcycloalkylamine of C1-C50, substituted or unsubstituted alkylcycloalkylthiol of C1-C50, substituted or unsubstituted alkylcycloalkylalcohol of C1-C50, substituted or unsubstituted alkylcycloalkylester of $C_1$-$C_{50}$, and substituted or unsubstituted alkylcycloalkylamide of C1-C50.

When the organic layer includes a dielectric material, it can serve as a dielectric layer.

Examples of the substituted or unsubstituted alkylamine of C1-C50 include 2-ethylhexylamine, 3,7-dimethyloctylamine, hexylamine, heptylamine, octylamine, dodecylamine, and octadecylamine. Examples of the substituted or unsubstituted alkylthiol of C1-C50 include 2-ethylhexylthiol, 3,7-dimethyloctylthiol, hexylthiol, heptylthiol, octylthiol, dodecylthiol, and octadecylthiol. Examples of the substituted or unsubstituted alkylester of C1-C50 include 2-ethylhexylester, 3,7-dimethyloctylester, hexylester, heptylester, octylester, dodecylester, and octadecylester. Examples of the substituted or unsubstituted alkylamide of C1-C50 include 2-ethylhexylamide, 3,7-dimethyloctylamide, hexylamide, heptylamide, octylamide, dodecylamide, and octadecylamide. Examples of the substituted or unsubstituted alkylcycloalkylamine of C1-C50 include 4-methylcyclohexylamine, 4-(3',7')-dimethyloctylcyclohexylamine, 4-hexylcyclohexylamine, 4-heptylcyclohexylamine, 4-octylcyclohexylamine, 4-dodecylcyclohexylamine, and 4-octadecylcyclohexylamine. Examples of the substituted or unsubstituted alkylcycloalkylthiol of C1-C50 include 4-methylcyclohexylthiol, 4-(3',7')-dimethyloctylcyclohexylthiol, 4-hexylcyclohexylthiol, 4-heptylcyclohexylthiol, 4-octylcyclohexylthiol, 4-dodecylcyclohexylthiol, and 4-octadecylcyclohexylthiol. Examples of the substituted or unsubstituted alkylcycloalkylalcohol of C1-C50 include 4-methylcyclohexylalcohol, 4-(3',7')-dimethyloctylcyclohexylalcohol, 4-hexylcyclohexylalcohol, 4-heptylcyclohexylalcohol, 4-octylcyclohexylalcohol, 4-dodecylcyclohexylalcohol, and 4-octadecylcyclohexylalcohol. Examples of the substituted or unsubstituted alkylcycloalkylester of C1-C50 include 4-methylcyclohexylester, 4-(3',7')-dimethyloctylcyclohexylester, 4-hexylcyclohexylester, 4-heptylcyclohexylester, 4-octylcyclohexylester, 4-dodecylcyclohexylester, and 4-octadecylcyclohexylester. Examples of the substituted or unsubstituted alkylcycloalkylamide of C1-C50 include 4-methylcyclohexylamide, 4-(3',7')-dimethyloctylcyclohexylamide, 4-hexylcyclohexylamide, 4-heptylcyclohexylamide, 4-octylcyclohexylamide, 4-dodecylcyclohexylamide, and 4-octadecylcyclohexylamide.

Preferably, the organic layer includes dodecylamine, dodecylthiol, or dodecylamide.

Preferably, the organic layer has a thickness of 0.1 to 20 nm.

The light emitting layer of the present invention includes a light-emitting material and the metal nanoparticles coated with the organic layer. The metal nanoparticles are used in an amount of 0.01 to 10 parts by weight, based on 100 parts by the total weight of the light-emitting layer (that is, the total weight of a light-emitting material and the metal nanoparticles coated with the organic layer). If the content of the metal nanoparticles is less than 0.01 parts by weight, a color purity enhancement effect may be insufficient. On the other hand, if it exceeds 10 parts by weight, emission efficiency may be rapidly reduced.

The light-emitting material is one or more selected from the group consisting of a red light-emitting material, a green light-emitting material, and a blue light-emitting material, which are commonly used in an EL device. In the present invention, in particular, to enhance the color purity of a blue light-emitting band, a blue light-emitting material is used as the light-emitting material.

The blue light-emitting material can be divided into a blue light-emitting polymer or a low molecular weight blue light-emitting material. The blue light-emitting polymer may be selected from (poly)fluorenes, (poly)spirobifluorenes, and their derivatives. The low molecular weight blue light-emitting material may be selected from carbazoles such as dicarbazole stilbene (DCS) (also called as "bis[carbazole-(9)]-stilbene"), 4,4'-Bis(2,2'-diphenylethen-1-yl)biphenyl (DPBVi), and N,N'-Bis(naphthalene-1-yl)-N,N'-bis(phenyl)benzidine (α-NPD).

With respect to the red light-emitting material, a red light-emitting polymer may be selected from poly(1,4-phenylenevinylene) derivatives. Examples of the poly(1,4-phenylenevinylene) derivatives include poly[2-methoxy-5-(2-ethylhexyloxy)-1,4-phenylenevinylene](MEH-PPV), poly[2,5-bis(2'-ethylhexyl)-1,4-phenylenevinylene](BEH-PPV), and poly[2,5-hexyloxy p-phenylene cyanovinylene](CN—PPV).

There are no limitations on a low molecular weight green light-emitting material and a low molecular weight red light-emitting material provided that they are those commonly used in an organic EL device. Examples of the low molecular weight green light-emitting material include 10-(2-benzothiazolyl)-2,3,6,7-tetrahydro-1,1,7,7-tetramethyl-1H,5H,11H-[1]benzopyrano[6,7,8-ij]quinolizine (C545T), tri(8-hydroxyquinolato)aluminum (Alq3), and tris(2-(2-pyridylphenyl-C,N))iridium (II)(Ir)ppy. Examples of the low molecular weight red light-emitting material include Nile Red, 4-(dicyanomethylene)-2-methyl-6-(juloidin-4-yl-vinyl)-4H-pyrane (DCM2), 2,3,7,8,12,13,17,18-octaethyl, 21H,23H-porphyrin platinum (II)(PEOEP), and 4-(dicyanomethylene)-2-tertbutyl-6-(1,1,7,7-tetramethyljulolidyl-9-enyl)-4H-pyrane.

Hereinafter, a method for preparing a light-emitting material doped with metal nanoparticles coated with an organic layer made of dodecylamine will be described in detail. However, the following method is provided only for illustrations and thus the present invention is not limited thereto.

First, a gold-containing salt such as hydrogen tetrachloroaurate(III) trihydrate ($HAuCl_4.3H_2O$) is dissolved in water. A solution of a phase transition catalyst in an organic solvent is then added thereto and stirred to obtain a reaction mixture. The organic solvent may be toluene, chlorobenzene, or xylene. The phase transition catalyst may be tetraoctylammoniumbromide or tetrahexylammoniumbromide.

An organic compound such as dodecylamine is added to the reaction mixture and stirred to obtain a precipitate complex of hydrogenated amine and gold salt anion ($Cl_2H_{25}NH_3$+ $AuCl_4^-$). The precipitate complex is subjected to addition of an aqueous solution of sodium borohydride ($NaBH_4$) and reduced with stirring to obtain gold nanoparticles coated with the organic layer made of the dodecylamine as a precipitate. The substance for forming organic layer such as dodecylamine is used in an amount of 1 to 100 moles, based on 1 mole of the gold-containing salt.

Next, the gold nanoparticles are blended with a light-emitting material to obtain a gold nanoparticles-doped light-emitting material. The light-emitting material is selected from fluorenes and spirobifluorenes. Preferably, the gold nanoparticles are used in an amount of 0.01 to 10 parts by weight, based on 100 parts by weight of the light-emitting layer.

A method of manufacturing a multilayer EL device as shown in FIG. 1 using a light-emitting material doped with metal nanoparticles will now be described.

First, an anode active material is coated on a substrate to form an anode. The substrate may be a substrate commonly used in an organic EL device. Preferably, the substrate is selected from a glass substrate and a transparent plastic substrate, which are good in transparency, surface smoothness, handling property, and water resistance. The anode active material may be selected from indium tin oxide (ITO), indium zinc oxide (IZO), tin dioxide ($SnO_2$), and zinc oxide (ZnO), which are good in transparency and conductivity.

A conductive buffer layer is selectively formed on the anode. The conductive buffer layer may be made of PEDOT (Poly-2,3-ethylenedioxy thiophene)/PSS (Polystyrene sulphonate).

Metal nanoparticles and a light-emitting material are dissolved in an organic solvent such as chlorobenzene, toluene, and xylene to obtain a coating solution. Then, the coating solution is spin-coated on the conductive buffer layer and thermally treated to form a light emitting layer. A method of forming the light emitting layer may vary according to materials used for the light emitting layer. For example, an ink-jet method, a laser thermal method, a stamping method, or a vacuum thermal deposition method may be used.

A cathode active material is thermally vacuum-deposited on the light emitting layer to form a cathode. This completes the EL device as shown in FIG. 1. In FIG. 1, a reference numeral 1 denotes the anode, a reference numeral 2 denotes the light emitting layer, and a reference numeral 3 denotes the cathode. The conductive buffer layer interposed between the anode and the light emitting layer is not shown.

The cathode active material may be lithium (Li), magnesium (Mg), aluminum (Al), aluminum-lithium (Al—Li), calcium (Ca), magnesium-indium (Mg—In), or magnesium-silver (Mg—Ag).

An EL device of the present invention may further include one or more intermediate layers such as a hole injection layer, a hole transport layer, an electron transport layer, a hole blocking layer, an electron transport layer, and an electron injection layer.

Hereinafter, the present invention will be described more specifically by Examples. However, the following Examples are provided only for illustrations and thus the present invention is not limited to or by them.

EXAMPLE 1

Synthesis of Polyfluorene (a) Synthesis of 9,9'-dioctyl-2,7-dibromofluorene monomer

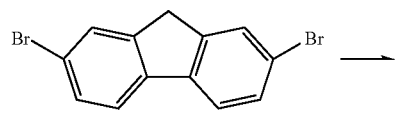

-continued

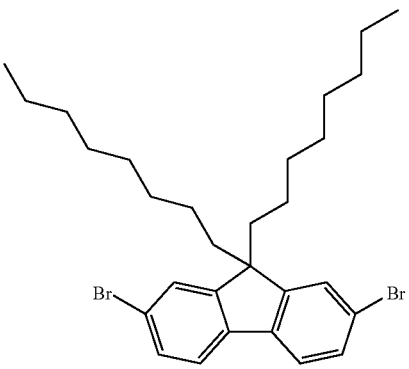

25 g (77 mmol) of 2,7-dibromofluorene and 36 g (185 mmol) of octylbromide were dissolved in 100 ml of toluene and 1.25 g (3.85 mmol) of tetrabutylammonium bromide was then added thereto. Then, a sodium hydroxide aqueous solution obtained by dissolving 31 g (770 mmol) of sodium hydroxide in 50 ml water was added to the reaction mixture and maintained for one day.

After the reaction was terminated, the resultant solution was extracted with water:chloroform (2:1 volumetric ratio). An obtained organic layer was dried over magnesium sulfate ($MgSO_4$) and concentrated. A concentrate was purified by column chromatography using n-hexane as an eluent and distilled under a reduced pressure to remove an octylbromide residue. As a result, 40 g (yield 95%) of 9,9'-dioctyl-2,7-dibromofluorene was obtained. The structure of the 9,9'-dioctyl-2,7-dibromofluorene was identified by $^1$H-NMR spectrum.

(b) Synthesis of Poly(9,9'-dioctyl-2,7-fluorene)

A flask was several times subjected to vacuum and nitrogen reflux to completely remove moisture. 880 mg (3.2 mmol) of Ni(COD) and 500 mg (3.2 mmol) of bipyridine contained in a glove box were placed in the flask and then several times subjected to vacuum and reflux. Then, 10 ml of anhydrous dimethylformamide, 346 mg (3.2 mmol) of 1,5-cyclooctadiene, and 10 ml of anhydrous toluene were added under a nitrogen atmosphere and stirred at 80° C. for 30 minutes. A diluted solution of 1.03 g (1.28 ml) of the 9,9'-dioctyl-2,7-dibromofluorene of the section (a) in 10 ml of toluene was then added and stirred for 30 minutes. 1 ml of bromopentafluorobenzene was then added and stirred for 16 hours. The resultant solution was poured into a solution of hydrochloric acid:acetone:methanol (1:1:2 volumetric ratio) and stirred for 12 hours or more. An obtained precipitate was dried and subjected to a sequential soxlet extraction with methanol and chloroform. As a result, 450 mg (yield: 60%) of poly(9,9'-dioctyl-2,7-fluorene) was obtained.

EXAMPLE 2

Synthesis of Polyspirobifluorene (a) Synthesis of Monomer (a-1) Synthesis of Compound (B)

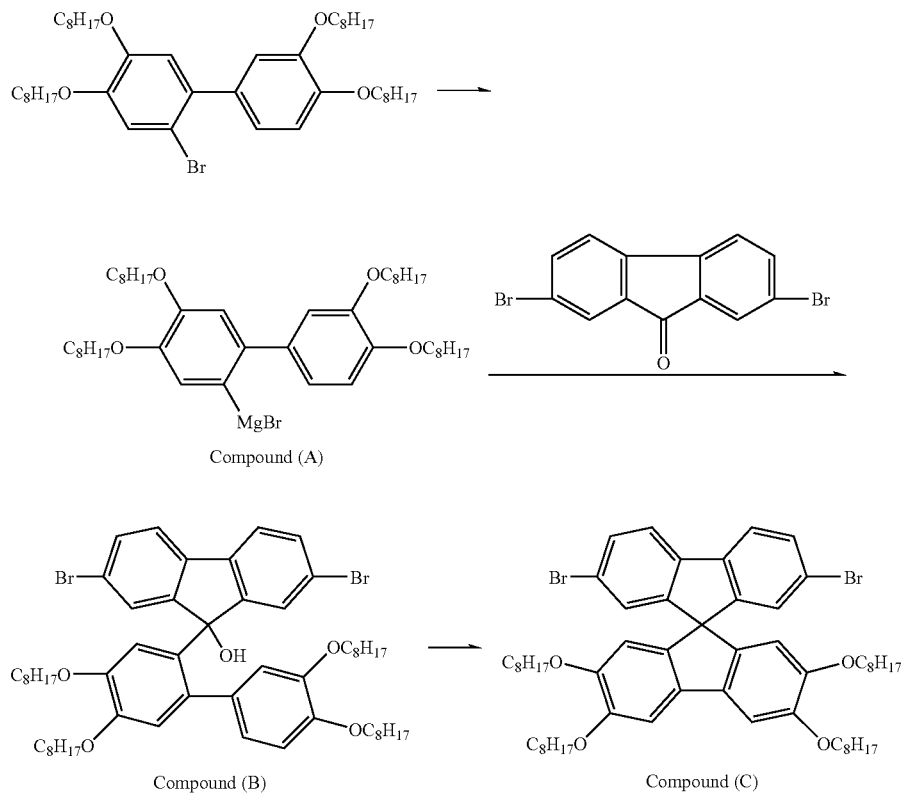

The compound (A) was obtained from 2-bromo-4,5-di(2-ethylhexyloxy)biphenyl.

The compound (A) in 50 ml ether was added to a solution of 3.36 g (10 mmol) of 2,7-dibromo-9-fluorenone in 50 ml ether and stirred under reflux overnight.

After the reaction was terminated, the resultant solution was cooled, and the yellow solid powders were filtered and three times washed with ether. Then, the resultant product was added to ammonium chloride and stirred for 10 hours. The precipitate was filtered, three times washed with water, and recrystallized with ethanol to obtain the compound (B) of a yellow solid (yield 83%).

(a-2) Synthesis of Compound (C)

5.0 g (5 mmol) of the compound (B) was added to 15 ml of $CH_3COOH$ and gently refluxed. 0.5 ml of hydrochloric acid was then added to the reaction mixture and refluxed for one hour.

After the reaction was terminated, the resultant solution was cooled to room temperature, and solid powders were filtered and three times washed with water. The resultant product was recrystallized with ethanol to obtain the compound (C) of a white powder (yield 75%).

(b) Synthesis of Poly[2,7-(2',3',6',7'-tetra(2-ethylhexyloxy)spirobifluorene)]

A flask was several times subjected to vacuum and nitrogen reflux to completely remove moisture. 880 mg (3.2 mmol) of Ni(COD) and 500 mg (3.2 mmol) of bipyridine contained in a glove box were placed in the flask and then several times subjected to vacuum and reflux. Then, 10 ml of anhydrous dimethylformamide, 346 mg (3.2 mmol) of 1,5-cyclooctadiene, and 10 ml of anhydrous toluene were added under a nitrogen atmosphere and stirred at 80° C. for 30 minutes. A diluted solution of 2.62 g of the compound (C) in 10 ml of toluene was then added and stirred for 30 minutes. 1 ml of bromopentafluorobenzene was then added and stirred for 16 hours. The resultant solution was poured into a solution of hydrochloric acid:acetone:methanol (1:1:2 volumetric ratio) and stirred for 12 hours or more. An obtained precipitate was dried and subjected to a sequential soxlet extraction with methanol and chloroform. As a result, 1.3 g (yield: 60%) of poly[2,7-(2',3',6',7'-tetra(2-ethylhexyloxy)spirobifluorene)] was obtained.

EXAMPLE 3

Preparation of Dodecylamine-Coated Gold Nanoparticles (DA-Au NPs)

112 mg (0.284 mmol) of $HAuCl_4.3H_2O$ was dissolved in 25 ml of distilled water and rapidly stirred. A solution of 0.389 g (0.71 mmol, 2.5 equivalents) of $N(C_8H_{17})_4Br$ in 25 ml of toluene was then added and continuously stirred until an orange color disappeared. When the reaction mixture turned colorless, a solution of 0.574 g (3.10 mmol) of dodecylamine in 25 ml of toluene was added to the reaction mixture with rapidly stirring. After adding the solution of dodecylamine, a dark beige precipitate was created in the reaction mixture, and then the resulting solution was stirred for 10 minutes. Then, a solution of 0.165 g (4.36 mmol) of NaBH$_4$ in 25 ml of distilled water was added and vigorously stirred at room temperature in an atmosphere condition for 12 hours.

After the reaction was terminated, an aqueous layer was discarded and a toluene layer was distilled under a reduced pressure to a concentration of 5 ml. 350 ml of ethanol was added to the toluene concentrate to obtain a precipitate. The precipitate-containing solution was kept at −60° C. for 12 hours. The resultant dark violet precipitate was filtered through a 0.65 μm nylon filter paper, washed with excess ethanol, and vacuum dried to give spherical DA-Au NPs with a particle diameter of 5.3±1.1 mm.

Figure 2:
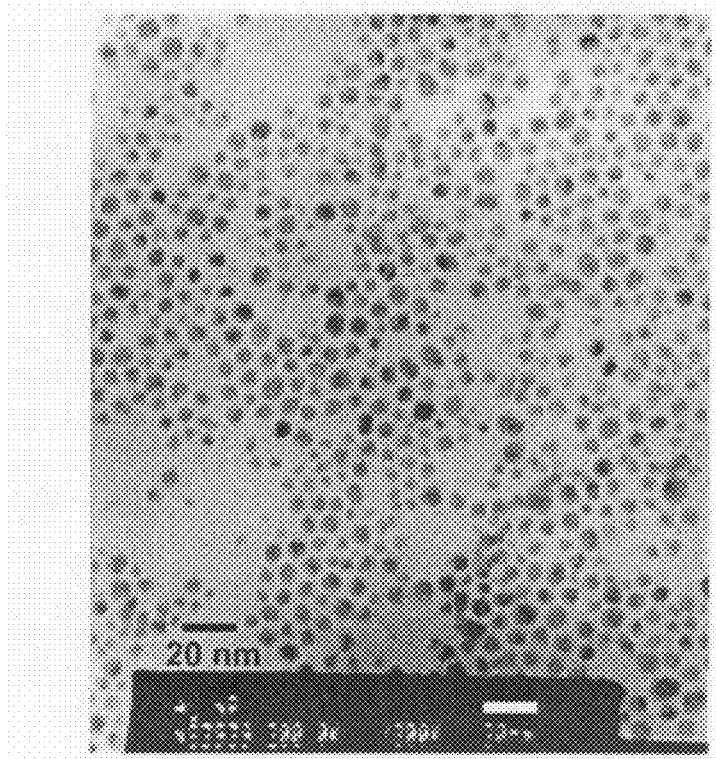
FIG. 2 is a transmission electron microphotograph of dodecylamine-Au nanoparticles (DA-Au NPs) according to Example 3 of the present invention.

The transmission electron microphotograph (TEM) of the DA-Au NPs is shown in FIG. 2.

Referring to FIG. 2, it can be seen that the DA-Au NPs had an average particle diameter of about 5.3 nm.

EXAMPLE 4

Preparation of PF Doped with DA-Au NPs (PF-Au NPs) and SP Doped with DA-Au NPs (SP-Au NPs)

Each of the PF of Example 1 and the SP of Example 2 was mixed with the DA-Au NPs of Example 3 (weight ratio: 100:0, 99:1, 98:2, and 96:4) in chlorobenzene for one hour to obtain PF doped with DA-Au NPs and SP doped with DA-Au NPs.

The optical characteristics of the PF doped with DA-Au NPs and the SP doped with DA-Au NPs were evaluated and the results are shown in FIGS. 3A, 3B, 4A, and 4B.

Figure 3A:
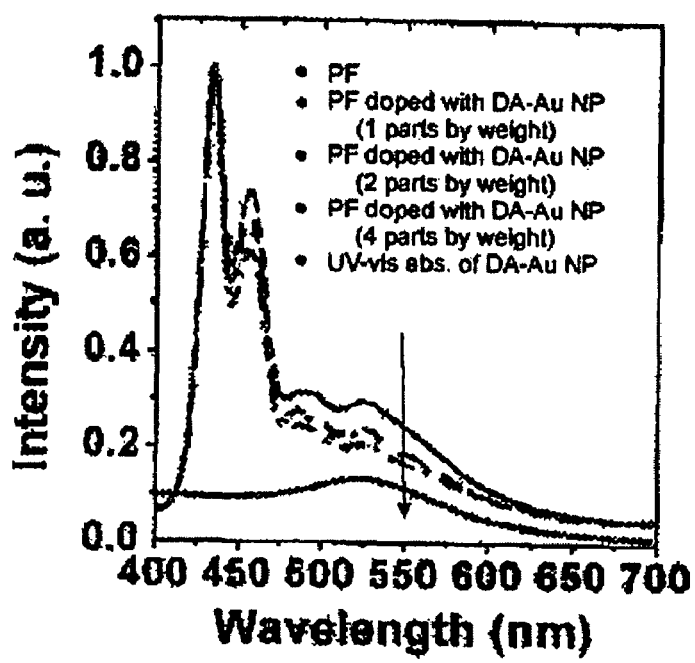
FIGS. 3A and 3B illustrate respectively PL and EL spectra of polyfluorenes (PFs) doped with DA-Au NPs according to Example 4 of the present invention.
Figure 3B:
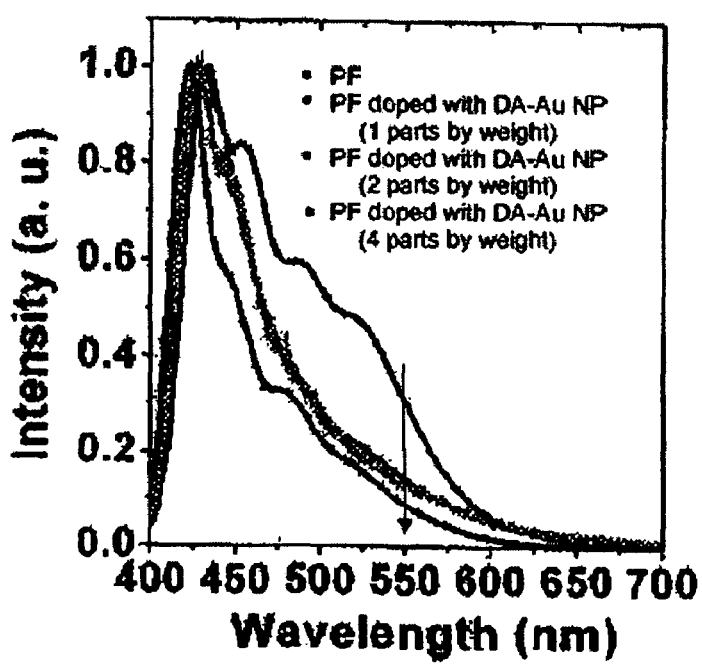
Figure 4A:
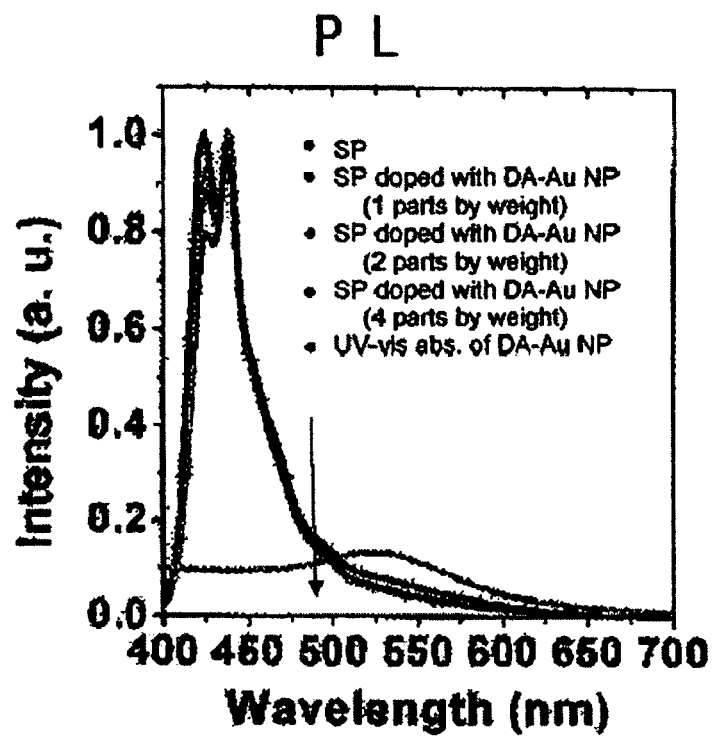
FIGS. 4A and 4B illustrate respectively PL and EL spectra of spirobifluorenes (SPs) doped with DA-Au NPs according to Example 4 of the present invention.
Figure 4B:
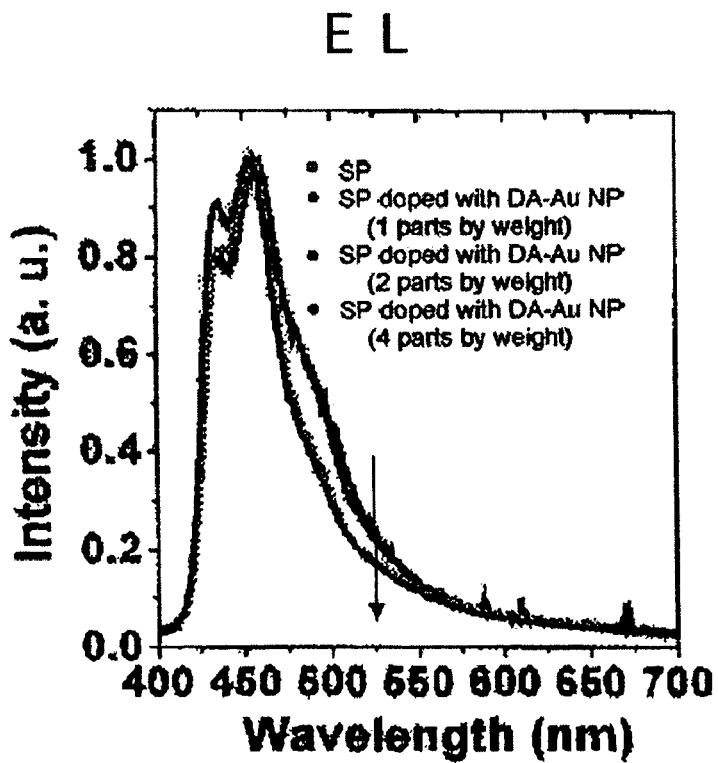
Figure 5A:
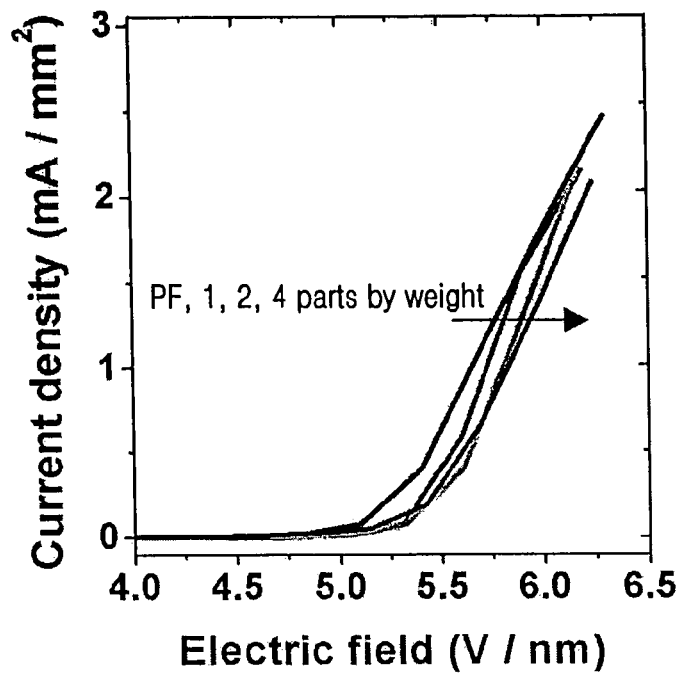
FIGS. 5A and 5B are graphs that illustrate the current density-electric field correlations of EL devices according to Example 5 of the present invention.
Figure 5B:
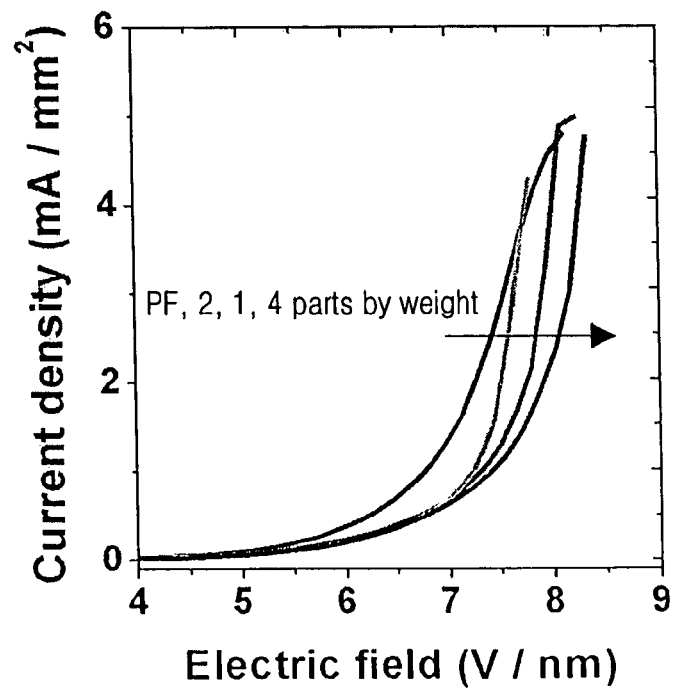
Figure 6A:
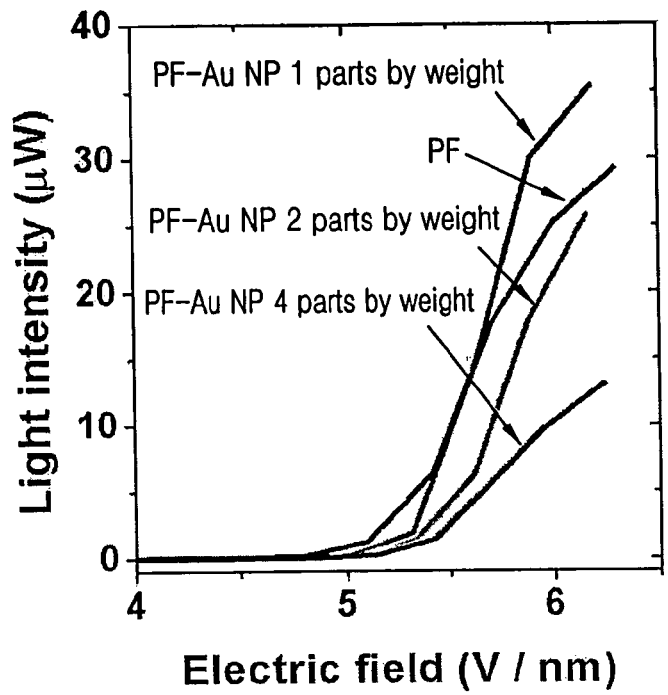
FIGS. 6A and 6B are graphs that illustrate the light intensity-electric field correlations of EL devices according to Example 5 of the present invention.
Figure 6B:
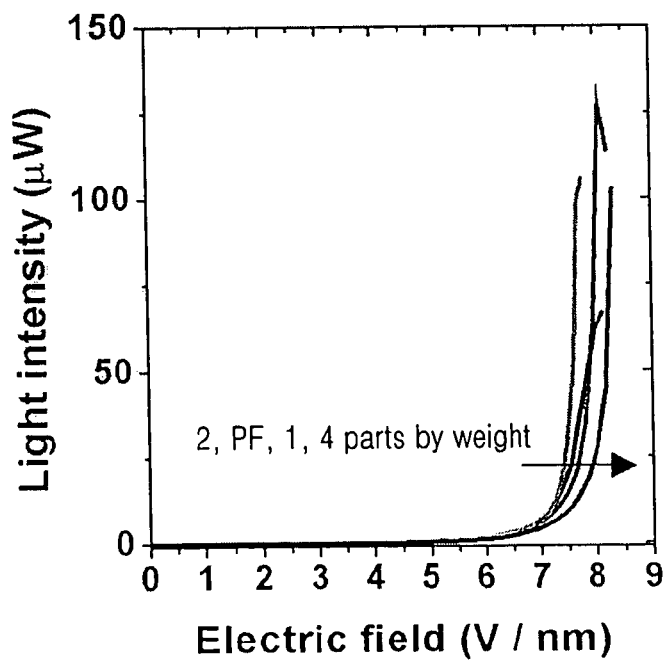
Figure 7A:
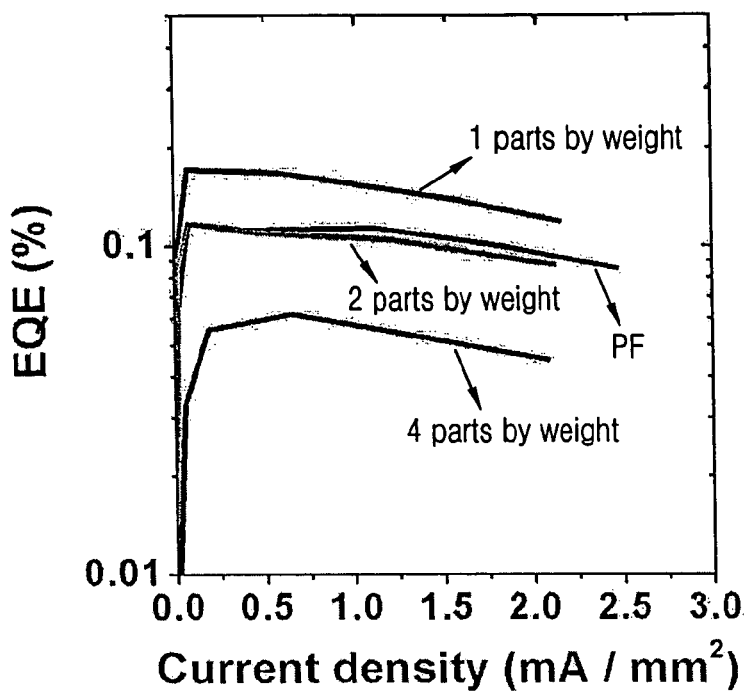
FIGS. 7A and 7B are graphs that illustrate the current density-external quantum efficiency (EQE) correlations of EL devices according to Example 5 of the present invention.
Figure 7B:
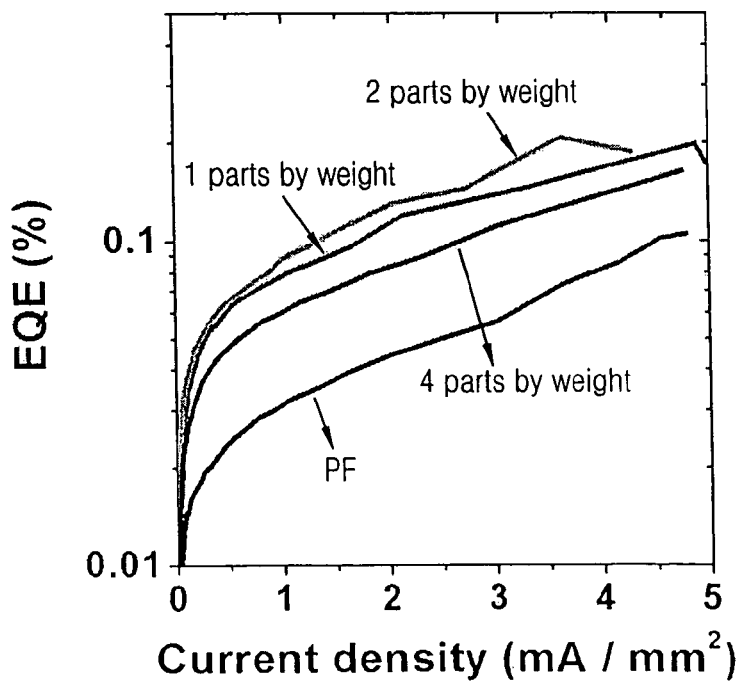

FIG. 3A shows UV-vis absorption of DA-Au NPs and PL spectra of the PF doped with DA-Au NPs which are different in weight ratio between the PF and the DA-Au NPs. FIG. 3B shows EL spectrum of the PF doped with DA-Au NPs which are different in weight ratio between the PF and the DA-Au NPs. FIG. 4A shows UV-vis absorption of DA-Au NPs and PL spectra of the SP doped with DA-Au NPs which are different in weight ratio between the SP and the DA-Au NPs. FIG. 4B shows EL spectrum of the SP doped with Au NPs which are different in weight ratio between the SP and the DA-Au NPs Referring to FIGS. 3A, 3B, 4A, and 4B, even when the PF polymers are doped with the DA-Au NPs, no changes of PL and EL peaks were observed. However, the absorption spectrum of the DA-Au NPs was about 524 nm, which overlapped with a long wavelength band (ca. 490-600 nm) produced from an excimer of the PF in the PL spectrum. The intensity of the long wavelength band decreased with increasing the content of the DA-Au-NPs. The SP polymers also exhibited the same effect as the PF polymers, even though the degree of the effect decreased due to a decrease in the PL and EL spectra of the SP polymers overlapping with the absorption spectrum of the DA-Au-NPs. These results show that energy transfer from the PF and SP polymers used as chromophores to the DA-Au-NPs occurred, and thus, the long wavelength energy produced from an excimer lowering chromaticity and emission efficiency was removed. Therefore, it can be concluded that the removal of an emission peak at a specific wavelength band by an energy transfer is more efficiently performed by an organic layer promoting the energy transfer.

EXAMPLE 5

Manufacturing and Characteristics Evaluation of EL Devices

EL devices were manufactured using the PF doped with DA-Au NPs and SP doped with DA-Au NPs of Example 4 according to the following method.

First, a transparent electrode substrate obtained by coating ITO on a glass substrate was clearly washed and then patterned to a desired shape using a photosensitve resin and an etchant followed by washing. PEDOT:PSS was coated to a thickness of 30 nm on the substrate to form a conductive buffer layer. Then, each solution of the PF or SP doped with DA-Au NPs of Example 4 was spin-coated to a thickness of 80 nm on the conductive buffer layer and subjected to solvent removal by baking to form a polymer film. Then, Li:Al (0.2 wt % Li) was deposited on the polymer film using a vacuum coater. A film thickness and a growth rate during the deposition were adjusted by a crystal sensor. As a result, EL devices with a structure of ITO/PEDOT:PSS/polymer doped with DA-Au NPs/Li:Al (0.2 wt % Li) were obtained.

The EL characteristics of the EL devices were evaluated and the results are summarized in Tables 1 and 2. The EL characteristics of the EL devices using the PF doped with DA-Au NPs are presented in Table 1 and the EL characteristics of the EL devices using the SP doped with DA-Au NPs are presented in Table 2.

TABLE 1

| DA-Au NPs content (parts by weight) | Turn-on voltage (V/nm) | Maximum emission intensity ($W_{max}$) | External quantum efficiency (%) |
|---|---|---|---|
| 0 | 4.6 | 29 | 0.11 |
| 1 | 4.7 | 35 | 0.17 |
| 2 | 4.8 | 26 | 0.12 |
| 4 | 5 | 13 | 0.060 |

TABLE 2

| DA-Au NPs content (parts by weight) | Turn-on voltage (V/nm) | Maximum emission intensity ($W_{max}$) | External quantum efficiency (%) |
|---|---|---|---|
| 0 | 3.7 | 66 | 0.11 |
| 1 | 3.7 | 127 | 0.20 |
| 2 | 3.8 | 105 | 0.21 |
| 4 | 4 | 102 | 0.16 |

With respect to the PF, the chromaticity coordinate of the PF was changed from (0.280, 0.362) to (0.201, 0.180) without reducing an emission efficiency. Such significant reduction of the y value induced chromaticity enhancement.

Current density-electric field correlations, electric field-emission intensity correlations, and current density-emission efficiency correlations of the EL devices of Example 5 are respectively shown in FIGS. 5A-5B, 6A-6B, and 7A-7B.

The EL device using the PF doped with DA-Au NPs (1 part by weight) exhibited a light intensity of 35 μW and an external quantum efficiency of 0.17%, which are respectively 1.2 times higher than the light intensity (29 μW) and 1.7 times higher than the external quantum efficiency (0.11%) of the EL device using the PF using no DA-Au NPs (0 parts by weight).

However, the EL devices using the PF doped with DA-Au NPs exhibited lowered device characteristics with an increase in the content of the DA-Au NPs. The EL devices using the SP doped with DA-Au NPs were enhanced in all characteristics in comparison with the EL devices using no nanoparticles.

As apparent from the above descriptions, the present invention provides an EL device using metal nanoparticles coated with an organic layer which is improved in color purity and emission efficiency as a result of removing an emission peak appearing at an excimer level.

The metal nanoparticles coated with the organic layer of the present invention can be used for formation of a light emitting layer of an EL device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An electroluminescent device, comprising:
   a pair of electrodes; and
   a light emitting layer interposed between said pair of electrodes, the light emitting layer comprising a light-emitting material and metal nanoparticles coated with an organic layer, the organic layer comprising at least one selected from the group consisting of substituted alkylamine of C1-C50, unsubstituted alkylamine of C1-C50, substituted alkylcycloalkylamine of C1-C50, unsubstituted alkylcycloalkylamine of C1-C50, 2-ethylhexylamine, 3,7-dimethyloctylamine, hexylamine, heptylamine, octylamine, dodecylamine, octadecylamine, 2-ethylhexylester, 3,7-dimethyloctylester, hexylester, heptylester, octylester, dodecylester, octadecylester, 2-ethylhexylamide, 3,7-dimethyloctylamide, hexylamide, heptylamide, octylamide, dodecylamide, octadecylamide, 4-methylcyclohexylamine, 4-(3',7')-dimethyloctylcyclohexylamine, 4-hexylcyclohexylamine, 4-heptylcyclohexylamine, 4-octylcyclohexylamine, 4-dodecylcyclohexylamine, 4-octadecylcyclohexylamine, 4-methylcyclohexylthiol, 4-(3', 7')-dimethyloctylcyclohexylthiol, 4-hexylcyclohexylthiol, 4-heptylcyclohexylthiol, 4-octylcyclohexylthiol, 4-dodecylcyclohexylthiol, 4-octadecylcyclohexylthiol, 4-methylcyclohexylalcohol, 4-(3',7')-dimethyloctylcyclohexylalcohol, 4-hexylcyclohexylalcohol, 4-heptylcyclohexylalcohol, 4-octylcyclohexylalcohol, 4-dodecylcyclohexylalcohol, 4-octadecylcyclohexylalcohol, 4-methylcyclohexylester, 4-(3',7')-dimethyloctylcyclohexylester, 4-hexylcyclohexylester, 4-heptylcyclohexylester, 4-octylcyclohexylester, 4-dodecylcyclohexylester, 4-octadecylcyclohexylester, 4-methylcyclohexylamide, 4-(3', 7')-dimethyloctylcyclohexylamide, 4-hexylcyclohexylamide, 4-heptylcyclohexylamide, 4-octylcyclohexylamide, 4-dodecylcyclohexylamide, and 4-octadecylcyclohexylamide.

2. The electroluminescent device of claim 1, wherein the light-emitting material is at least one selected from the group consisting of a red light-emitting material, a blue light-emitting material, and a green light-emitting material.

3. The electroluminescent device of claim 1, wherein the metal nanoparticles are used in an amount of 0.01 to 10 parts by weight, based on 100 parts by the total weight of the light emitting layer.

4. The electroluminescent device of claim 1, wherein the light-emitting material is at least one selected from the group consisting of polyfluorene, substituted polyfluorene, polyspirobifluorene, substituted polyspirobifluorene, their derivatives, and their blends.

5. The electroluminescent device of claim 4, wherein the light-emitting material is selected from the group consisting of poly(9,9'-dioctyl-2,7-fluorene) and poly [2,7-(2',3',6',7'-tetra(2-ethylhexyloxy)spirobifluorene)].

6. The electroluminescent device of claim 5, wherein the organic layer is at least one selected from the group consisting of dodecylamine, and dodecylamides.

7. The electroluminescent device of claim 1, wherein the metal nanoparticles are at least one selected from the group consisting of lithium (Li), sodium (Na), potassium (K), magnesium (Mg), aluminum (Al), silicon (Si), germanium (Ge), indium-antimony (InSb), gold (Au), and silver (Ag).

8. The electroluminescent device of claim 1, wherein the metal nanoparticles have an average particle diameter of 0.1 to 50 nm.

9. The electroluminescent device of claim 1, wherein the organic layer has a thickness of 0.1 to 20 nm.

10. The electroluminescent device of claim 1, wherein the organic layer comprises at least one of the substituted or unsubstituted alkylamine of C1-C50 and the substituted or unsubstituted alkylcycloalkylamine of Cl C50.

* * * * *